(12) United States Patent
Kopikare

(10) Patent No.: US 8,095,091 B1
(45) Date of Patent: Jan. 10, 2012

(54) TRANSMIT POWER AMPLIFICATION CONTROL FOR WIRELESS DEVICE

(75) Inventor: Milind Kopikare, San Jose, CA (US)

(73) Assignee: Marvell International Ltd. (BM)

( * ) Notice: Subject to any disclaimer, the term of this patent is extended or adjusted under 35 U.S.C. 154(b) by 763 days.

(21) Appl. No.: 12/123,281

(22) Filed: May 19, 2008

Related U.S. Application Data

(60) Provisional application No. 60/938,816, filed on May 18, 2007.

(51) Int. Cl.
*H01Q 11/12* (2006.01)
*H04B 1/04* (2006.01)

(52) U.S. Cl. .......... 455/127.1; 455/127.2; 455/127.5; 455/126; 455/115.1

(58) Field of Classification Search .......... 455/115.1, 455/115.3, 127.1, 127.5, 574, 226.2, 245.1, 455/250.1, 277.2
See application file for complete search history.

(56) References Cited

U.S. PATENT DOCUMENTS

| | | | | |
|---|---|---|---|---|
| 5,909,643 A * | 6/1999 | Aihara | | 455/127.3 |
| 6,052,572 A * | 4/2000 | Imura | | 455/343.5 |
| 6,169,449 B1 * | 1/2001 | Hasegawa | | 330/51 |
| 6,208,846 B1 * | 3/2001 | Chen et al. | | 455/127.3 |
| 6,362,685 B1 * | 3/2002 | Vagher | | 330/124 R |
| 6,397,090 B1 * | 5/2002 | Cho | | 455/574 |
| 6,539,050 B1 * | 3/2003 | Lee et al. | | 375/146 |
| 6,591,087 B1 * | 7/2003 | Oda | | 455/78 |
| 7,257,094 B2 * | 8/2007 | Shoemake | | 370/311 |
| 7,317,903 B2 * | 1/2008 | Omori et al. | | 455/127.3 |
| 7,512,097 B2 | 3/2009 | Jelitto et al. | | |
| 7,653,408 B1 * | 1/2010 | Kopikare et al. | | 455/522 |
| 2004/0043731 A1 * | 3/2004 | Xiong | | 455/130 |

OTHER PUBLICATIONS

U.S. Appl. No. 10/962,376, filed Oct. 8, 2004, Kopikare et al.

* cited by examiner

*Primary Examiner* — Duc M Nguyen

(57) ABSTRACT

A system and method are disclosed for controlling transmit power amplification in a wireless transmitting device. A processor receives data to determine whether a communication channel from a transmitting device to a receiving device is strong enough to support a target data transmit rate of the devices with a power amplifier either on or off. The processor controls a switching device between a data transmitter circuit and the transmitter's antenna based on the quality of the communication channel. In a first state, the switching device connects the data transmitter circuit to the power amplifier to increase the strength of the signal communicated to the antenna. In a second state, the switching device bypasses the power amplifier. The power amplifier is turned off when the switch is in the second state, thereby decreasing the power consumed by the transmitting device as it transmits data at the target data transmit rate.

30 Claims, 6 Drawing Sheets

TRANSMIT POWER AMPLIFICATION CONTROL FOR WIRELESS DEVICE

RELATED APPLICATION

This application claims the benefit of U.S. Provisional Application No. 60/938,816, filed on May 18, 2007, which is incorporated herein by reference.

BACKGROUND

1. Technical Field

The present disclosure relates to the field of wireless communication, and more particularly to selectively activating and deactivating a power amplifier in a wireless device for controlling the power of a data transmit signal.

2. Related Art

The maximum rate of data transfer (measured as megabits per second (Mbps), for example) from a wireless transmitting device to a receiving device may be dependent upon one or more of the following: the communication protocol, the antenna configurations of the devices, the quality of the communication channel, the power level of the transmitted signal, whether the receiving device includes a power amplifier, the distance between the devices, and other factors. Devices are configured to transfer (transmit and receive) data up to a maximum data transfer rate that is typically specified by the communication protocol used. Many transmitting devices include a power amplifier to increase the strength of the data transmit signal. The increased strength of the transmit signal helps increase the data transfer rate up to the maximum (i.e., rated) data transfer rate.

The power amplifier in a transmitting device continuously consumes a significant amount of power. For example, a power amplifier in a wireless local area network (WLAN) chip may consume more than fifty percent of the total power supplied to the chip in transmit mode. As a result, the continuous operation of the power amplifier significantly decreases the battery life of the device. An improved approach is desirable.

BRIEF SUMMARY

The following embodiments relate to systems and methods of activating or deactivating a power amplifier in a wireless data transmitter based on the quality of a communication channel and/or the distance between a transmitting device having the data transmitter and a receiving device. The quality of the communication channel may be based on data indicating the strength of the communication channel, as an example. If the strength of the communication channel is great enough, and/or if the wireless data transmitter and the receiving device are within a predetermined distance, the power amplifier may be powered down to preserve the battery life of the transmitting device.

An apparatus comprises a transmitter to communicate a data transmit signal to a switch and a processor to control the switch based on at least one parameter of a wireless communication channel. The processor controls the switch to maintain a target data transfer rate and may determine a distance between a transmitting device and a receiving device. In a first state the switch communicates the data transmit signal to bypass a power amplifier, and in a second state the switch communicates the data transmit signal to the power amplifier. The at least one parameter may be selected from a group consisting of: a successful data transfer rate from the transmitter to a receiving device, a received signal strength indication, and a packet error ratio. The processor may be configured to activate the switch to the first state if the at least one parameter is above a first threshold, and activate the switch to a second state if the at least one parameter is below a second threshold. Also, the processor may switch the power amplifier off if the at least one parameter is above the first threshold, and switch the power amplifier on if the at least one parameter is below the second threshold. The first threshold may be equal to the second threshold. The transmitter and the processor may comprise a wireless local area network chip.

A method comprises communicating a data transmit signal to a power amplifier if at least one parameter of a wireless communication channel is below a first threshold. The data transmit signal bypasses the power amplifier if the at least one parameter is above a second threshold. A target data transfer rate is maintained through the wireless communication channel. The distance between a transmitting device and a receiving device is determined based on the at least one parameter.

An apparatus comprises means for communicating a data transmit signal to a power amplifier or to bypass the power amplifier based on at least one quality parameter of a wireless communication channel. The apparatus may also include one or more of means for activating a switch to a first state if the at least one quality parameter is above a first threshold, and activating the switch to a second state if the at least one quality parameter is below a second threshold; means for switching the power amplifier on or off based on the at least one quality parameter; means for maintaining a target data transfer rate; and means for determining a distance between a transmitting device and a receiving device.

A computer readable storage medium has processor executable instructions to communicate a data transmit signal to a power amplifier if at least one parameter of a wireless communication channel is below a first threshold and communicate the data transmit signal to a signal path to bypass the power amplifier if the at least one parameter is above a second threshold. The computer readable storage medium may also have processor executable instructions to maintain a target data transfer rate through the wireless communication channel and/or determine a distance between a transmitting device and a receiving device based on the at least one parameter.

An apparatus comprises a switch to receive a data transmit signal and a processor to control the switch to communicate the data transmit signal away from a power amplifier in a first state, and to communicate the data transmit signal to the power amplifier in a second state. The processor may be configured to activate and deactivate the power amplifier. The processor may also be configured to determine a link quality from a transmitting device to a receiving device and control the switch based on the link quality. The link quality may be based on a received signal strength indication and a packet error ratio.

A method comprises receiving a data transmit signal and communicating the data transmit signal away from a power amplifier if a link quality is above a first threshold. The data transmit signal is communicated to the power amplifier if the link quality is below a second threshold. The power amplifier is deactivated if the link quality is above the first threshold. The link quality may be based on a received signal strength indication.

An apparatus comprises means for controlling a switch to communicate a data transmit signal away from a power amplifier in a first state, or communicate the data transmit signal to the power amplifier in a second state based on the link quality of a communication channel. The apparatus may also comprise one or more of: means for deactivating or activating the power amplifier; and means for determining a link quality from a transmitting device to a receiving device.

A computer readable storage medium has processor executable instructions to determine a link quality of a communication channel and communicate a data transmit signal away from a power amplifier if the link quality is above a first threshold or communicate the data transmit signal to the power amplifier if the link quality is below a second threshold. The processor executable instructions may also deactivate the power amplifier if the link quality is above the first threshold and/or control a switch in communication with the power amplifier based on the link quality.

A method comprises activating a power amplifier if a link quality of a communication channel is below a first threshold and deactivating the power amplifier if the link quality is above a second threshold. A link quality of the communication channel may be determined based upon a received signal strength indication, as an example. A target data transfer rate is maintained while the power amplifier is deactivated. The distance between a transmitting device having the power amplifier and a receiving device may be determined based on the link quality.

An apparatus comprises a processor configured to activate a power amplifier if a link quality of a communication channel is below a first threshold and deactivate the power amplifier if the link quality is above a second threshold. The processor may determine the link quality based upon a received signal strength indication and/or determine a distance between a transmitting device and a receiving device based on the link quality.

An apparatus comprises means for activating or deactivating a power amplifier based on a link quality of a communication channel. The link quality may be based upon a received signal strength indication. The apparatus may also include means for determining a distance between a transmitting device and a receiving device.

A computer readable storage medium has processor executable instructions to activate a power amplifier if a link quality of a communication channel is below a first threshold and deactivate the power amplifier if the link quality is above a second threshold. The processor executable instructions may also determine a distance between a transmitting device and a receiving device based on the link quality.

Other systems, methods, and features of the invention will be, or will become, apparent to one with skill in the art upon examination of the following figures and detailed description. It is intended that all such additional systems, methods, features and advantages be included within this description, be within the scope of the invention, and be protected by the following claims.

The preferred embodiments will now be described with reference to the attached drawings.

DETAILED DESCRIPTION OF THE PRESENTLY PREFERRED EMBODIMENTS

The disclosure can be better understood with reference to the following drawings and description. The components in the figures are not necessarily to scale, emphasis instead being placed upon illustrating the principles of the invention. Moreover, in the figures, like referenced numerals designate corresponding parts or elements throughout the different views.

The embodiments below relate to a power amplification control circuit for selectively activating and deactivating a power amplifier in a wireless transmitting device such as a laptop computer, a desktop computer, a cell phone, a personal digital assistant, a wireless keyboard, monitor, mouse, or other device. The power amplification control circuit includes a transmit power control circuit that regularly determines the quality of the communication channel from the wireless transmitting device to a receiving device. The receiving device may be any of the devices mentioned above or other device that receives a wireless signal.

Based on the quality of the communication channel, the transmit power control circuit controls a switching device between a data transmitter circuit and the transmitter's antenna. In a first state, the switching device connects the data transmitter circuit to a power amplifier to increase the strength of the data signal communicated to the antenna. In a second state, the switching device disconnects and bypasses the power amplifier. The power amplifier is turned off or otherwise reduced to an inactive state when the switch is in the second state, thereby decreasing the power consumed by the transmitting device and extending the life of the transmitting device's battery.

Figure 1:
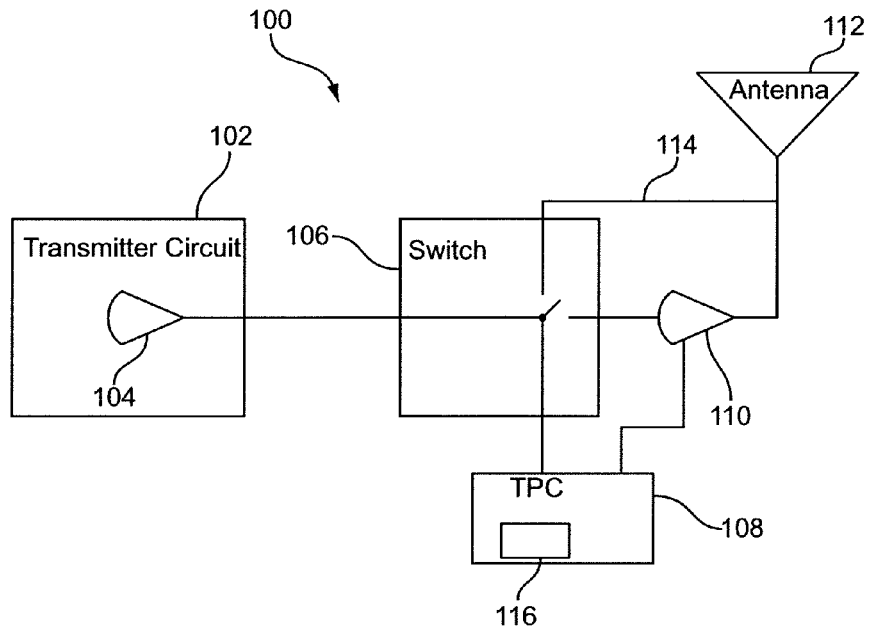
FIG. 1 is block diagram of an embodiment of a power amplification control circuit of the present invention.

FIG. 1 is block diagram showing an embodiment of a power amplification control circuit 100. The power amplification control circuit 100 includes a data transmitter circuit 102, such as a radio frequency (RF) transceiver or other circuit, a switch 106, a transmit power control circuit 108, a power amplifier 110, and an antenna 112. Components of the power amplification control circuit 100 may be part of a WLAN integrated circuit (chip) or other integrated circuit in a wireless device, as examples. For example, in an embodiment a WLAN chip includes the transmitter circuit 102, the switch 106, and the transmit power control circuit 108. In this embodiment, the power amplifier 110 and the antenna 112 are external to the WLAN chip. In another embodiment, the power amplifier 110 is also part of the WLAN chip and may be referred to as an "internal power amplifier." The WLAN chip may include one or more of the following devices (not shown) in communication with one or more of the components of the power amplification control circuit 100: a baseband processor (BBP), a media access control (MAC) device, a physical-layer (PHY) device, interfaces, firmware, memory, processors, or any other system on chip (SOC) components.

Other integration schemes for the components of the power amplification control circuit 100 are contemplated and within the scope of the invention.

The transmitter circuit 102 includes a pre-power amplifier signal driver 104 that outputs a data transmit signal. The data transmit signal is received by the switch 106. The switch 106 is in communication with and controlled by a processor 116. The switch 106 may be any type of switch, such as a general purpose input/output (GPIO) controlled switch, as an example. The processor 116 is configured to control the switch 106 based on the quality (also referred to as strength) of the communication channel (also referred to as the RF channel) from the power amplification control circuit 100 to a receiving device (not shown). The quality of the communication channel may be determined by the processor 116 based on data related to the power present in the data signal received by the receiving device, the number of data errors reported to the transmitting device by the receiving device, and/or by some other method that determines the quality of a communication channel. An example of a communication channel quality measurement is a received signal strength indication (RSSI). RSSI values are determined by the receiving device and reported back to the transmitting device. An example of a measurement of data error indicative of the quality of a communication channel is the packet error ratio (PER). The PER is determined by the receiving device and reported back to the transmitting device. The communication channel quality as indicated by RSSI or PER may be expressed as a value having arbitrary units, such as LQ (link quality). A rising LQ value may be indicative that the transmitting device and receiving device are moving closer together. Likewise, a falling LQ value may be indicative that the transmitting device and receiving device are moving further apart. Regardless of whether the devices are moving closer together or further apart, a changing LQ value indicates that the quality of the communication channel is increasing or decreasing.

The processor 116 may be a hardware, software, or firmware processor configured to control the switch 106 and the power amplifier 110 based on the quality of the communication channel as indicated by an RSSI, PER, LQ, and/or other value. Hereinafter, for clarity of explanation the quality of the communication channel will be considered an LQ value, although additional or other values and/or parameters may be relied upon as an indication of the quality of the communication channel.

In an embodiment, if the processor 116 determines that the quality of the communication channel is above a first link quality ($LQ_1$) threshold, it communicates a control signal to the switch 106 to bypass the power amplifier 110. The control signal may also be communicated to the power amplifier 110 to turn it off. In another embodiment, the processor 116 communicates a separate signal to the power amplifier 110 to turn it off. If the processor 116 determines that the quality of the communication channel is below a second link quality ($LQ_2$) threshold, it communicates a control signal to the switch 106 to include the power amplifier 110 in the signal path to the antenna 112. The control signal may also be communicated to the power amplifier 110 to turn it on. Alternatively, the processor 116 may communicate a separate signal to the power amplifier 110 to turn it on.

Figure 2:
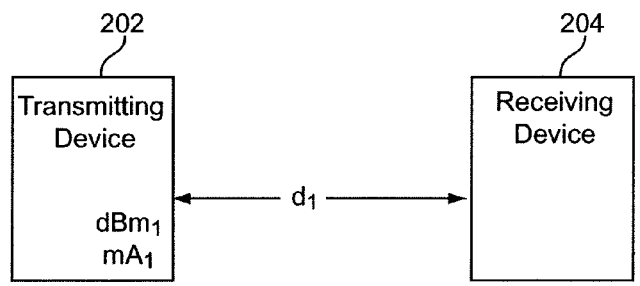
FIG. 2 illustrates a first distance between a transmitter and a receiver that requires power amplification of a transmit signal.
Figure 3:
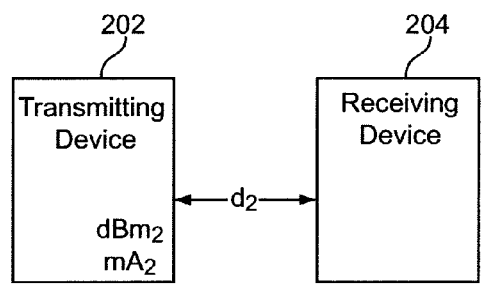
FIG. 3 illustrates a second distance between a transmitter and a receiver that does not require power amplification of a transmit signal.

FIGS. 2 and 3 illustrate an example of controlling the on/off state of the power amplifier 110 as the distance between the receiving device 204 and the transmitting device 202 changes, as indicated by a changing LQ value. It is to be understood that any specific values discussed below are provided for explanatory purposes only and are not to be interpreted as limiting the scope of the invention.

In FIG. 2, the distance from the transmitting device 202 to the receiving device 204 is expressed as $d_1$. In FIG. 3, the distance from the transmitting device 202 to the receiving device 204 is expressed as $d_2$, where $d_2<d_1$. By way of example, the transmitting device 202 may be a laptop computer and the receiving device 204 may be a Wi-Fi access point. The distance $d_1$ may be 3 meters (or more) and the distance $d_2$ may be 1 meter (or less), as an example.

In FIG. 2, the power amplifier 110 is on. Because the power amplifier 110 also affects the LQ value, at distance $d_1$ with the power amplifier 110 on the LQ value is high enough to maintain a target data transfer rate. For example, at a distance $d_1=3$ meters the power amplifier 110 may output a 17 dBm ($dBm_1$) signal. If the LQ is strong at 17 dBm, the receiving device 204 will receive data at the target data transfer rate. The target data transfer rate may be, for example, the maximum (i.e., device rated) or near maximum transmit rate for the devices 202, 204. At $d_1$ with the power amplifier 110 on, the total power ($mA_1$) consumed by the power amplification control circuit 100 is equal to the sum of the power consumed by the transmitter circuit 102 and the power consumed by the power amplifier 110 for transmitting the data signal.

FIG. 3 illustrates that the receiving device 204 has moved closer to the transmitting device 202. The processor 116 may detect this movement by a rising LQ value. In response to the rising LQ value, the processor 116 switches the power amplifier 110 off and controls the switch 116 so that the transmit signal bypasses the power amplifier 110. In this state and at this distance ($d_2$), the signal strength ($dBm_2$) is provided by only the transmitter circuit 102. With the power amplifier 110 off and bypassed, the processor 116 continues to monitor RSSI and PER data to determine whether the quality of the communication channel is above $LQ_1$, and strong enough to maintain the target data transfer rate. Provided the communication channel continues to support the target data transfer rate, the processor 116 maintains the state of the switch 106 and power is preserved by having the power amplifier 110 off. The processor 116 continues to monitor the quality of the communication channel to determine whether to turn the power amplifier 110 on or off and control the switch 106 accordingly.

The power amplification control circuit 100 may be implemented as discussed above where the power amplifier 110 is in one or two states: either off or on. In this version, the power amplifier 110 has only one amplification level. Alternatively, the power amplification control circuit 100 may control the power amplifier 110 to be off or to transmit at one of two or more selectable transmit power levels. In this embodiment, the power amplification control circuit 100, upon detecting a wireless link of insufficient quality, adjusts the power level and/or data rate of the transmitted signal to obtain successful transmissions. The processor 116 may iteratively adjust the power level of the transmitted signal, via the power amplifier 110, and determine the LQ to achieve the target data transfer rate at the lowest power amplifier 110 power level (including switching off the power amplifier 110).

Figure 4:
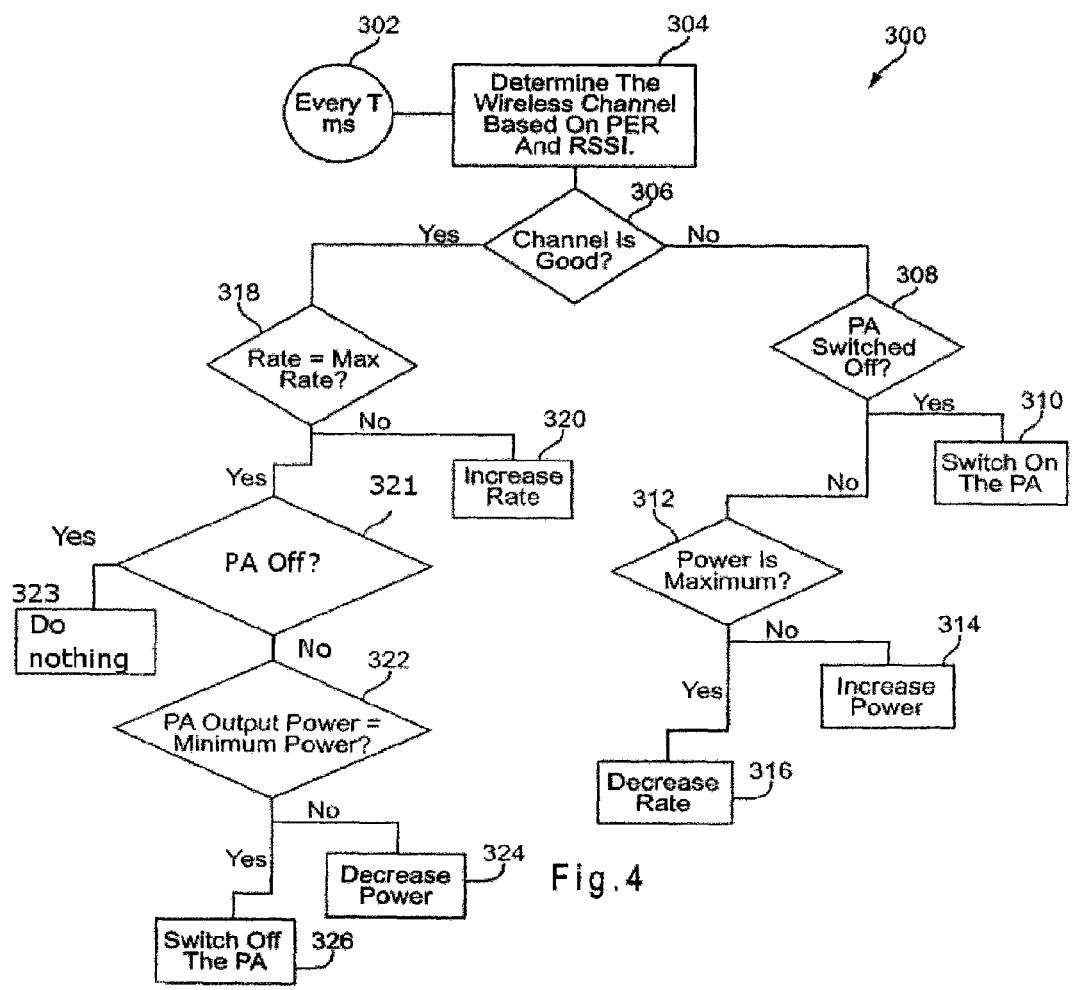
FIG. 4 shows acts of an embodiment of the present invention for controlling the amount of current supplied to a power amplifier.

FIG. 4 shows Acts 300 of an embodiment of the present invention for controlling the amount of power supplied to a power amplifier. The Acts 300 of FIG. 4 include acts for switching on and off the power amplifier, as discussed above with reference to FIGS. 1-3, and acts for incrementally increasing and/or decreasing the amount of power supplied to the power amplifier to adjust the LQ.

The Acts 300 of FIG. 4 are initiated at Act 304 every time interval T (Act 302). Time interval T may be one or several milliseconds, or any other time interval, either fixed or updateable. RSSI and PER data are referenced to determine the strength of the communication channel, which may include determining an LQ value, from a transmitting device to a receiving device (Act 302). If it is determined that the communication channel is not strong enough to support the maximum (or target) transmit rate of the transmitting and receiving devices (Act 306), it is determined whether the power amplifier is on or off (Act 308). If it is determined that the power amplifier is off, then the power amplifier is switched on (Act 310). If the power amplifier is on, then it is determined whether the power amplifier is operating at its maximum ("high threshold") power (Act 312). If the power amplifier is not operating at its maximum power, the power to the power amplifier is increased (Act 314). If the power amplifier is operating at its maximum power, then the transmit data rate is decreased (Act 316) to obtain successful transmissions.

Returning to Act 306, if it is determined that the communication channel is strong enough to support the maximum (or target) transmit rate of the transmitting and receiving devices, it is determined whether the transmitting device is transmitting at the maximum transmit rate (Act 318). If the transmitting device is not transmitting at the maximum transmit rate, the transmit rate is increased (Act 320). If the transmitting device is transmitting at the maximum transmit rate, it is determined whether the power amplifier is off (Act 321), which if so nothing occurs (Act 323). If the power amplifier is on, it is determined whether the power amplifier output power is at its minimum ("low threshold") output power (Act 322). If the power amplifier output power is not at its minimum output power, the power amplifier output power is decreased (Act 324). If the power amplifier output power is at a minimum output power, the power amplifier is switched off (Act 326). As stated above, the Acts 300 may be repeated every time interval T to obtain successful transmissions at the lowest power amplifier power level.

Further acts for incrementally increasing and/or decreasing the output power of a power amplifier are disclosed in U.S. patent application Ser. No. 10/962,376, entitled "Self-Adaptive Transmit Power Control for Wireless Network," filed on Oct. 8, 2004, the contents of which are incorporated herein by reference.

Figure 5A:
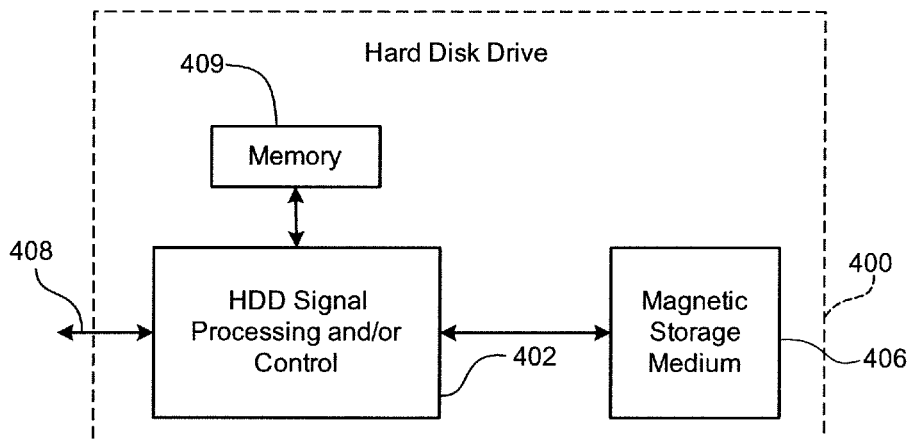
FIG. 5(a) is a functional block diagram of a hard disk drive.

Referring now to FIGS. 5(a) to 5(h), various exemplary implementations of the present invention are shown. Referring to FIG. 5(a), the present invention may be embodied in a hard disk drive (HDD) 400. HDD 400 may communicate with a host device (not shown) such as a computer, mobile computing devices such as personal digital assistants, cellular phones, media or MP3 players and the like, and/or other devices via a wireless communication link 408.

The present invention may be implemented with either or both signal processing and/or control circuits, which are generally identified in FIG. 5(a) at 402. In some implementations, the signal processing and/or control circuit 402 and/or other circuits (not shown) in the HDD 400 may process data, perform coding and/or encryption, perform calculations, and/or format data that is output to and/or received from a magnetic storage medium 406. HDD 400 may be connected to memory 409, such as random access memory (RAM), a low latency nonvolatile memory such as flash memory, read only memory (ROM) and/or other suitable electronic data storage.

Figure 5B:
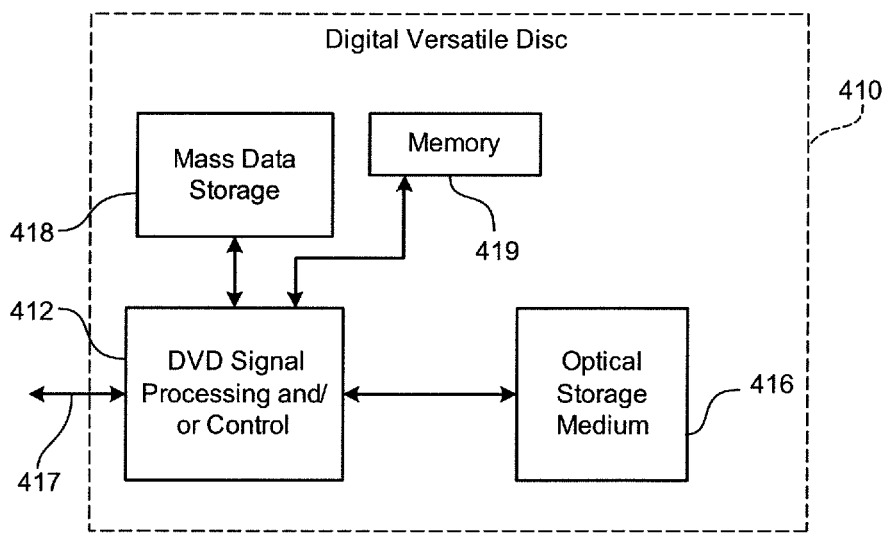
FIG. 5(b) is a functional block diagram of a digital versatile disk (DVD)

Referring now to FIG. 5(b), the present invention may be implemented in a digital versatile disc (DVD) drive 410. The present invention may be implemented in either or both signal processing and/or control circuits, which are generally identified in FIG. 5(b) at 412, and/or mass data storage 418 of DVD drive 410. Signal processing and/or control circuit 412 and/or other circuits (not shown) in DVD drive 410 may process data, perform coding and/or encryption, perform calculations, and/or format data that is read from and/or data written to an optical storage medium 416. In some implementations, signal processing and/or control circuit 412 and/or other circuits (not shown) in DVD drive 410 can also perform other functions such as encoding and/or decoding and/or any other signal processing functions associated with a DVD drive.

DVD drive 410 may communicate with a device (not shown) such as a computer, television or other device via a wireless communication link 417. DVD drive 410 may communicate with mass data storage 418 that stores data in a nonvolatile manner. Mass data storage 418 may include a HDD such as that shown in FIG. 5(a). The HDD may be a mini HDD that includes one or more platters having a diameter that is smaller than approximately 1.8". DVD drive 410 may be connected to memory 419, such as RAM, ROM, low latency nonvolatile memory such as flash memory, and/or other suitable electronic data storage.

Figure 5C:
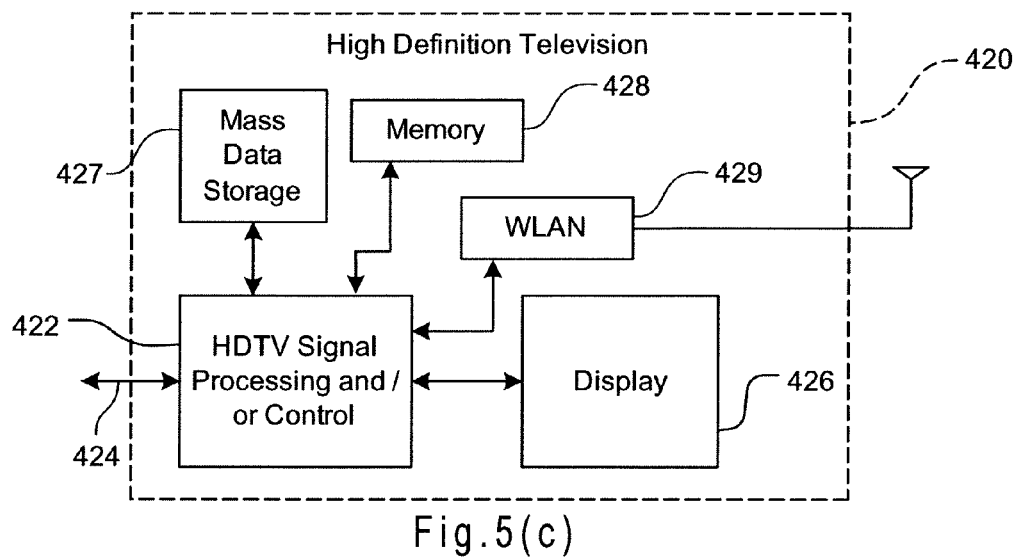
FIG. 5(c) is a functional block diagram of a high definition television.

Referring now to FIG. 5(c) the present invention may be embodied in a high definition television (HDTV) 420. The present invention may be implemented in either or both signal processing and/or control circuits, which are generally identified in FIG. 6(c) at 422, a WLAN interface 429 and/or mass data storage 427 of the HDTV 420. HDTV 420 may receive HDTV input signals in a wireless format via a wireless communication link 424 and generate HDTV output signals for a display 426. In some implementations, signal processing circuit and/or control circuit 422 and/or other circuits (not shown) of HDTV 420 may process data, perform coding and/or encryption, perform calculations, format data and/or perform any other type of HDTV processing that may be required.

HDTV 420 may communicate with mass data storage 427 that stores data in a nonvolatile manner such as optical and/or magnetic storage devices. At least one HDD may have the configuration shown in either FIG. 5(a) and/or at least one DVD may have the configuration shown in FIG. 5(b). The HDD may be a mini HDD that includes one or more platters having a diameter that is smaller than approximately 1.8". HDTV 420 may be connected to memory 428 such as RAM, ROM, low latency nonvolatile memory such as flash memory and/or other suitable electronic data storage. HDTV 420 also may support connections with a WLAN via a WLAN network interface 429.

Figure 5D:
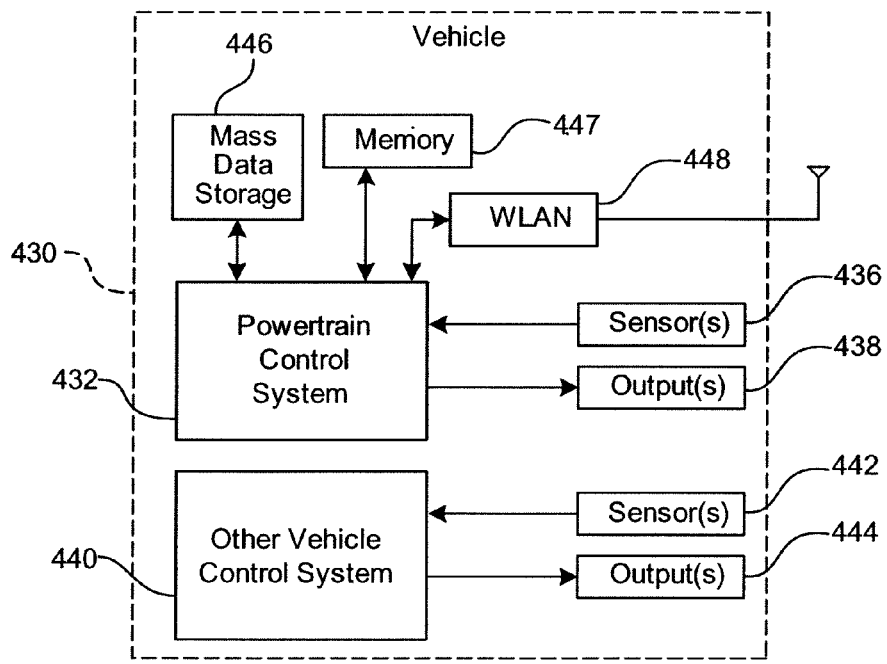
FIG. 5(d) is a functional block diagram of a vehicle control system.
Figure 5E:
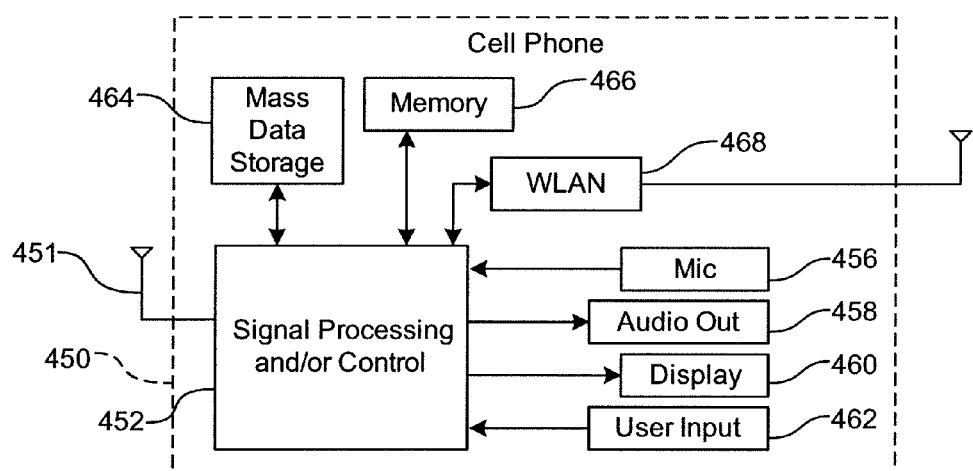
FIG. 5(e) is a functional block diagram of a cellular phone.
Figure 5F:
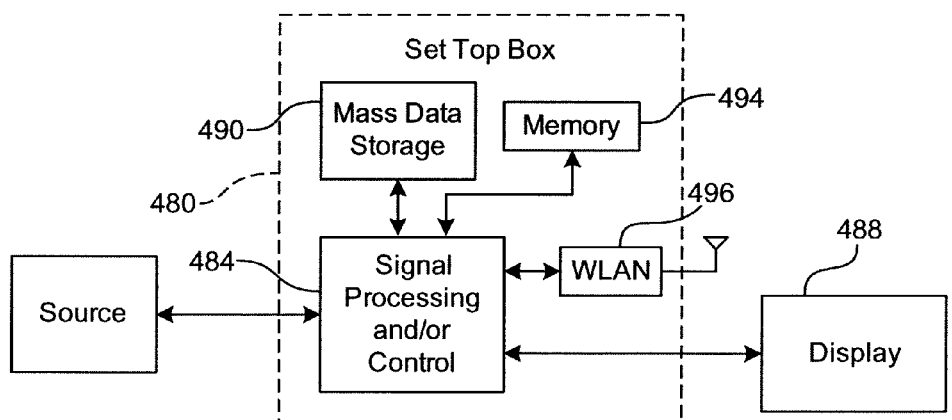
FIG. 5(f) is a functional block diagram of a set top box.
Figure 5G:
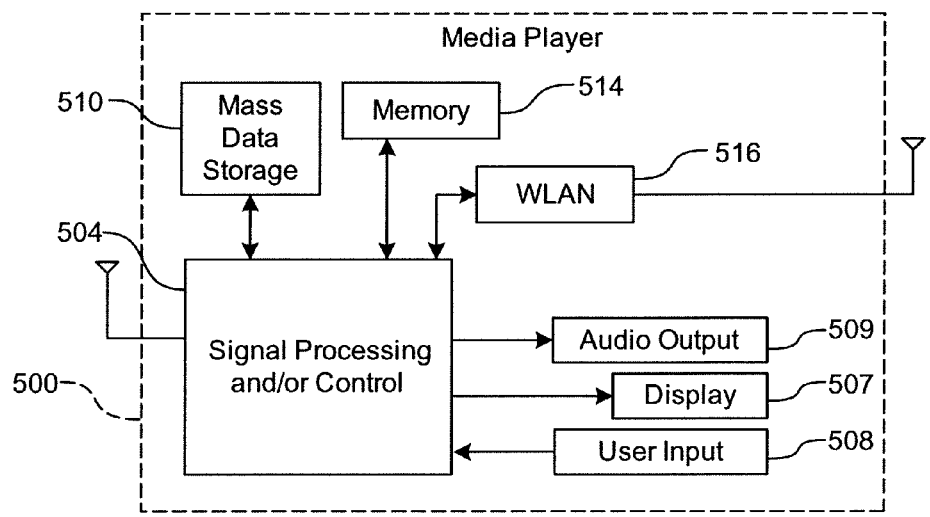
FIG. 5(g) is a functional block diagram of a media player.
Figure 5H:
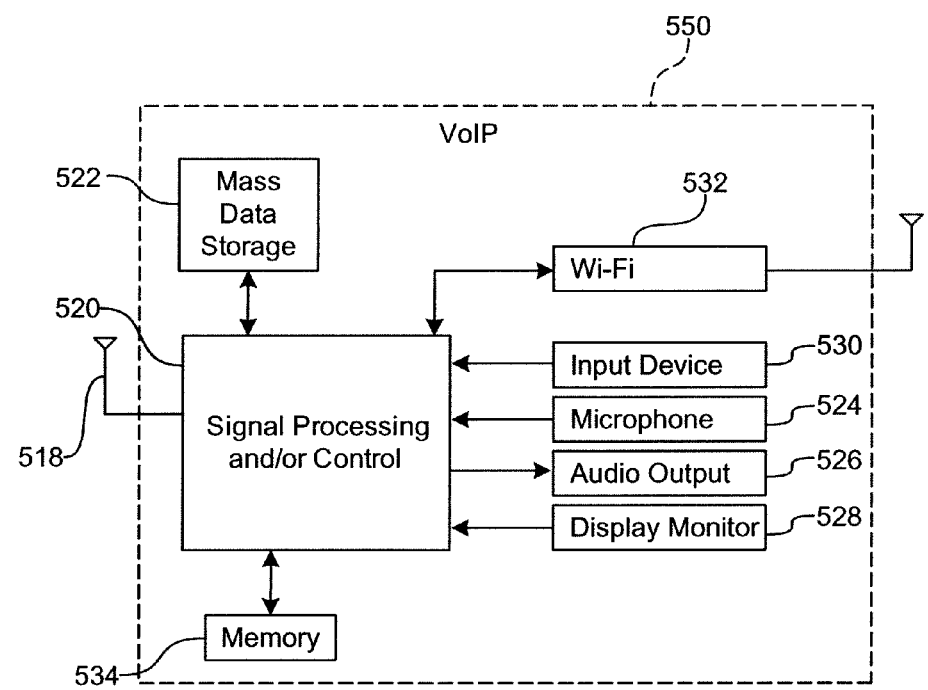
FIG. 5(h) is a functional block diagram of a VoIP phone.

Referring now to FIG. 5(d), the present invention may be implemented in a control system of a vehicle 430, a WLAN interface 448 and/or mass data storage 446 of the vehicle control system. In some implementations, the present invention is implemented in a power-train control system 432 that receives inputs from one or more sensors 436 such as temperature sensors, pressure sensors, rotational sensors, airflow sensors and/or any other suitable sensors and/or that generates one or more output control signals such as engine operating parameters, transmission operating parameters, and/or other control signals at one or more output(s) 438.

The present invention may also be embodied in other control systems 440 of vehicle 430. Control system 440 may likewise receive signals from input sensors 442 and/or output control signals to one or more output(s) 444. In some implementations, control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 432 may communicate with mass data storage 446 that stores data in a nonvolatile manner. Mass data storage 446 may include optical and/or magnetic storage devices, for example HDDs and/or DVDs. At least one HDD may have the configuration shown in FIG. 5(*a*) and/or at least one DVD may have the configuration shown in FIG. 5(*b*). The HDD may be a mini HDD that includes one or more platters having a diameter that is smaller than approximately 1.8". Powertrain control system 432 may be connected to memory 447 such as RAM, ROM, low latency nonvolatile memory such as flash memory and/or other suitable electronic data storage. Powertrain control system 432 also may support connections with a WLAN via a WLAN network interface 448. The control system 440 may also include mass data storage, memory and/or a WLAN interface (all not shown).

Referring now to FIG. 5(*e*), the present invention may be embodied in a cellular phone 450 that may include a cellular antenna 451. The present invention may be implemented in either or both signal processing and/or control circuits, which are generally identified in FIG. 5(*e*) at 452, a WLAN interface and/or mass data storage of the cellular phone 450. In some implementations, cellular phone 450 includes a microphone 456, an audio output 458 such as a speaker and/or audio output jack, a display 460 and/or an input device 462 such as a keypad, pointing device, voice actuation and/or other input device. Signal processing and/or control circuits 452 and/or other circuits (not shown) in cellular phone 450 may process data, perform coding and/or encryption, perform calculations, format data and/or perform other cellular phone functions.

Cellular phone 450 may communicate with mass data storage 464 that stores data in a nonvolatile manner such as optical and/or magnetic storage devices, for example HDDs and/or DVDs. At least one HDD may have a configuration shown in FIG. 5(*a*) and/or at least one DVD may have the configuration shown in FIG. 5(*b*). The HDD may be a mini HDD that includes one or more platters having a diameter that is smaller than approximately 1.8". Cellular phone 450 may be connected to memory 466 such as RAM, ROM, low latency nonvolatile memory such as flash memory and/or other suitable electronic data storage. Cellular phone 450 also may support connections with a WLAN via a WLAN network interface 468.

Referring now to FIG. 5(*f*), the present invention may be embodied in a set top box 480. The present invention may be implemented in either or both signal processing and/or control circuits, which are generally identified in FIG. 5(*f*) at 484, a WLAN interface 496 and/or mass data storage of the set top box 480. Set top box 480 receives signals from a source such as a broadband source and outputs standard and/or high definition audio/video signals suitable for a display 488 such as a television and/or monitor and/or other video and/or audio output devices. Signal processing and/or control circuits 484 and/or other circuits (not shown) of the set top box 480 may process data, perform coding and/or encryption, perform calculations, format data and/or perform any other set top box function.

Set top box 480 may communicate with mass data storage 490 that stores data in a nonvolatile manner. Mass data storage 490 may include optical and/or magnetic storage devices, for example HDDs and/or DVDs. At least one HDD may have a configuration shown in FIG. 5(*a*) and/or at least one DVD may have the configuration shown in FIG. 5(*b*). The HDD may be a mini HDD that includes one or more platters having a diameter that is smaller than approximately 1.8". Set top box 480 may be connected to memory 494 such as RAM, ROM, low latency nonvolatile memory such as flash memory and/or other suitable electronic data storage. Set top box 480 also may support connections with a WLAN via a WLAN network interface 496.

Referring now to FIG. 5(*g*), the present invention may be embodied in a media player 500. The present invention may be implemented in either or both signal processing and/or control circuits, which are generally identified in FIG. 5(*g*) at 504, a WLAN interface and/or mass data storage of the media player 500. In some implementations, media player 500 includes a display 507 and/or a user input 508 such as a keypad, touchpad and the like. In some implementations, media player 500 may employ a graphical user interface (GUI) that typically employs menus, drop down menus, icons and/or a point-and-click interface via display 507 and/or user input 508. Media player 500 further includes an audio output 509 such as a speaker and/or audio output jack. Signal processing and/or control circuits 504 and/or other circuits (not shown) of media player 500 may process data, perform coding and/or encryption, perform calculations, format data and/or perform any other media player function.

Media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage 510 may include optical and/or magnetic storage devices, for example HDDs and/or DVDs. At least one HDD may have a configuration shown in FIG. 5(*a*) and/or at least one DVD may have the configuration shown in FIG. 5(*b*). The HDD may be a mini HDD that includes one or more platters having a diameter that is smaller than approximately 1.8".

Media player 500 may be connected to memory 514 such as RAM, ROM, low latency nonvolatile memory such as flash memory and/or other suitable electronic data storage. Media player 500 also may support connections with a WLAN via a WLAN network interface 516. Still other implementations in addition to those described above are contemplated.

Referring to FIG. 5(*h*), the present invention may be embodied in a Voice over Internet Protocol (VoIP) phone 550 that may include an antenna 518. The present invention may be implemented in either or both signal processing and/or control circuits, which are generally identified in FIG. 5(*h*) at 520, a wireless interface and/or mass data storage of the VoIP phone 550. In some implementations, VoIP phone 550 includes, in part, a microphone 524, an audio output 526 such as a speaker and/or audio output jack, a display monitor 528, an input device 530 such as a keypad, pointing device, voice actuation and/or other input devices, and a Wi-Fi communication module 532. Signal processing and/or control circuits 520 and/or other circuits (not shown) in VoIP phone 550 may process data, perform coding and/or encryption, perform calculations, format data and/or perform other VoIP phone functions.

VoIP phone 550 may communicate with mass data storage 522 that stores data in a nonvolatile manner such as optical and/or magnetic storage devices, for example HDDs and/or DVDs. At least one HDD may have a configuration shown in FIG. 5(*a*) and/or at least one DVD may have the configuration shown in FIG. 5(*b*). The HDD may be a mini HDD that includes one or more platters having a diameter that is smaller than approximately 1.8". VoIP phone 550 may be connected to memory 534, which may be a RAM, ROM, low latency nonvolatile memory such as flash memory and/or other suitable electronic data storage. VoIP phone 550 is configured to establish communications link with a VoIP network (not shown) via Wi-Fi communication module 532.

All of the discussion above, regardless of the particular implementation being described, is exemplary in nature, rather than limiting. Although specific components of the power amplifier control circuit are described, methods, systems, and articles of manufacture consistent with power amplifier control circuit the may include additional or different components. For example, components of the power amplifier control circuit may be implemented by one or more of: control logic, hardware, a microprocessor, microcontroller, application specific integrated circuit (ASIC), discrete logic, or a combination of circuits and/or logic. Further, although selected aspects, features, or components of the implementations are depicted as hardware or software, all or part of the systems and methods consistent with the power amplifier control circuit may be stored on, distributed across, or read from machine-readable media, for example, secondary storage devices such as hard disks, floppy disks, and CD-ROMs; a signal received from a network; or other forms of ROM or RAM either currently known or later developed. Any act or combination of acts may be stored as instructions in computer readable storage medium. Memories may be DRAM, SRAM, Flash or any other type of memory. Programs may be parts of a single program, separate programs, or distributed across several memories and processors.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs and rule sets may be parts of a single program or rule set, separate programs or rule sets, or distributed across several memories and processors.

It is intended that the foregoing detailed description be understood as an illustration of selected forms that the invention can take and not as a definition of the invention. It is only the following claims, including all equivalents, that are intended to define the scope of this invention.

What is claimed is:

1. An apparatus comprising:
a transmitter to communicate a data transmit signal to a switch; and
a processor configured to control the switch based on at least one parameter of a wireless communication channel, wherein the at least one parameter includes a transmit rate;
wherein the processor is further configured to:
determine whether the transmit rate is equal or greater than the maximum target transmit rate;
in a first state in which the transmit rate is equal or greater than the maximum target transmit rate, control communication of the data transmit signal to bypass a power amplifier, the power amplifier having an output power,
in a second state, control communication of the data transmit signal to the power amplifier,
control the power amplifier to decrease the output power if the transmit rate of the data transmit signal is approximately equal to the maximum target transmit rate and the output power is greater than a minimum output power threshold, and
control communication of the data transmit signal to bypass the power amplifier if the output power is approximately equal to the minimum output power threshold.

2. The apparatus of claim 1 wherein the at least one parameter is selected from a group consisting of: a successful data transfer rate from the transmitter to a receiving device, a received signal strength indication, a packet error ratio, and the transmit rate.

3. The apparatus of claim 1 wherein the processor is configured to control communication of the data transmit signal to bypass the power amplifier to the first state if the at least one parameter is above a first threshold, and to control communication of the data transmit signal to the power amplifier if the at least one parameter is below a second threshold, where a way in which the data transmit signal is routed is maintained when the at least one parameter is between the first threshold and the second threshold.

4. The apparatus of claim 1 wherein the processor switches the power amplifier off if the at least one parameter is above a first threshold, and switches the power amplifier on if the at least one parameter is below a second threshold, where a power state of the power amplifier is maintained when the at least one parameter is between the first threshold and the second threshold.

5. The apparatus of claim 4 wherein the first threshold is equal to the second threshold.

6. The apparatus of claim 1 wherein the processor is configured to:
control the power amplifier to increase the output power if the transmit rate of the data transmit signal is less than the maximum target transmit rate, and
control the transmitter to decrease the transmit rate if the output power is approximately equal to an output power threshold and a quality measurement of the wireless communication channel is below a channel quality threshold.

7. A wireless local area network chip including the apparatus of claim 1.

8. The apparatus of claim 1 wherein the processor controls the switch to maintain a target data transfer rate.

9. The apparatus of claim 1 wherein the processor determines a distance between a transmitting device and a receiving device based on the at least one parameter.

10. A method comprising:
communicating a data transmit signal to a power amplifier if at least one parameter of a wireless communication channel is below a first threshold; and
communicating the data transmit signal to a signal path to bypass the power amplifier if the at least one parameter is above a second threshold, wherein a state of the power amplifier is maintained if the at least one parameter is between the first threshold and the second threshold; and
decreasing an output power of the power amplifier if a transmit rate of the data transmit signal is approximately equal to a maximum target transmit rate and the output power is greater than a minimum output power threshold; and
communicating the data transmit signal to a signal path to bypass the power amplifier if the transmit rate of the data transmit signal is approximately equal to the maximum target transmit rate and the output power is approximately equal to the minimum output power threshold.

11. The method of claim 10 wherein the at least one parameter is selected from a group consisting of: a successful data transfer rate from a transmitter to a receiving device, a received signal strength indication, and a packet error ratio.

12. The method of claim 10 wherein the first threshold is equal to the second threshold.

13. The method of claim 10 further comprising maintaining a target data transfer rate through the wireless communication channel.

14. The method of claim 10 further comprising determining a distance between a transmitting device and a receiving device based on the at least one parameter.

15. The method of claim 10, further comprising:
increasing the output power of the power amplifier if the transmit rate of the data transmit signal is less than the maximum target transmit rate; and
decreasing the transmit rate if the output power is approximately equal to a maximum output power threshold and a quality measurement of the wireless communication channel is below a channel quality threshold.

16. An apparatus comprising:
a switch to receive a data transmit signal; and
a processor configured to control the switch to communicate the data transmit signal to bypass a power amplifier in a first state when a transmit rate of the data transmit signal is approximately equal to a maximum target transmit rate, and to communicate the data transmit signal to the power amplifier in a second state,
wherein the switch is configured to transmit the data transmit signal via an antenna, and
wherein the power amplifier has an output power, and the processor is further configured to:
control the power amplifier to decrease the output power if the transmit rate of the data transmit signal is approximately equal to the maximum target transmit rate and the output power is greater than a minimum output power threshold, and
control the switch to the first state if the transmit rate of the data transmit signal is approximately equal to the maximum target transmit rate and the output power is approximately equal to the minimum output power threshold.

17. The apparatus of claim 16 wherein the processor is configured to deactivate the power amplifier if the switch is in the first state and to activate the power amplifier if the switch is in the second state.

18. The apparatus of claim 16 wherein the processor is configured to determine a link quality from a transmitting device to a receiving device and control the switch based on the link quality.

19. The apparatus of claim 18 wherein the link quality is based on a received signal strength indication.

20. The apparatus of claim 16 wherein the processor is configured to:
control the power amplifier to increase the output power if the transmit rate of the data transmit signal is less than the maximum target transmit rate, and
decrease the transmit rate if the output power is approximately equal to a maximum output power threshold and a quality measurement of the wireless communication channel is below a channel quality threshold.

21. A method comprising:
receiving a data transmit signal;
determining a link quality of a communication channel;
transmitting the data transmit signal via a first signal path if the link quality is above a first threshold;
transmitting the data transmit signal via a second signal path if the link quality is below a second threshold;
maintaining a signal path of the data transmit signal if the link quality is between the first threshold and the second threshold;
decreasing an output power of a power amplifier if a transmit rate of the data transmit signal is approximately equal to a target transmit rate and the output power is greater than an output power threshold; and
communicating the data transmit signal to the first signal path if the transmit rate of the data transmit signal is approximately equal to the target transmit rate and the output power is approximately equal to the output power threshold
wherein the first signal path does not include the power amplifier and the second signal path includes the power amplifier.

22. The method of claim 21 further comprising deactivating the power amplifier if the link quality is above the first threshold.

23. The method of claim 21 further comprising controlling a switch to select between the first signal path and the second signal path based on the link quality.

24. The method of claim 21 wherein the link quality is based on a received signal strength indication.

25. The method of claim 21, further comprising:
increasing the output power of the power amplifier if the transmit rate of the data transmit signal is less than the target transmit rate; and
decreasing the transmit rate if the output power is approximately equal to the output power threshold and the link quality is below the second threshold.

26. A method comprising:
activating a power amplifier if a link quality of a communication channel is below a first threshold;
deactivating the power amplifier if the link quality is above a second threshold;
maintaining an activation state of the power amplifier if the link quality is between the first threshold and the second threshold
decreasing an output power of the power amplifier if a transmit rate of a data transmit signal is approximately equal to a target transmit rate and the output power is greater than an output power threshold; and
deactivating the power amplifier if the transmit rate of the data transmit signal is approximately equal to the target transmit rate and the output power is approximately equal to the output power threshold.

27. The method of claim 26 further comprising determining the link quality based upon a received signal strength indication.

28. The method of claim 26 wherein a target data transfer rate is maintained while the power amplifier is deactivated.

29. The method of claim 26 further comprising determining a distance between a transmitting device and a receiving device based on the link quality.

30. A method comprising:
activating a power amplifier if a link quality of a communication channel is below a first threshold;
deactivating the power amplifier if the link quality is above a second threshold; maintaining an activation state of the power amplifier if the link quality is between the first threshold and the second threshold;
increasing an output power of the power amplifier if a transmit rate of a data transmit signal is less than a target transmit rate; and
decreasing the transmit rate if the output power is approximately equal to an output power threshold and the link quality is below the first threshold.

* * * * *